(12) United States Patent
Tsironis

(10) Patent No.: US 11,581,623 B1
(45) Date of Patent: Feb. 14, 2023

(54) ANTI-SKEWING LOAD PULL TUNER WITH ROTATING PROBE

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 80 days.

(21) Appl. No.: 17/308,261

(22) Filed: May 5, 2021

(51) Int. Cl.
H03H 7/40 (2006.01)
H01P 5/04 (2006.01)
H01P 5/18 (2006.01)
H01P 1/18 (2006.01)

(52) U.S. Cl.
CPC ............... H01P 5/04 (2013.01); H01P 1/182 (2013.01); H01P 5/18 (2013.01); H03H 7/40 (2013.01)

(58) Field of Classification Search
CPC .............. H01P 5/04; H01P 5/18; H01P 1/182; H03H 7/38; H03H 7/40; H04L 25/0278; G01R 1/26; G01R 1/24; G01R 35/005; G01R 27/32; G01R 27/28; G01R 31/2822; G01R 31/282; G01R 31/2601
USPC ......................................................... 333/263
See application file for complete search history.

(56) References Cited

U.S. PATENT DOCUMENTS

| | | |
|---|---|---|
| 9,257,963 B1 | 2/2016 | Tsironis |
| 9,625,556 B1 | 4/2017 | Tsironis |
| 10,345,422 B1 * | 7/2019 | Tsironis ............. G01R 31/2612 |
| 10,700,402 B1 | 6/2020 | Tsironis |
| 11,327,101 B1 * | 5/2022 | Tsironis ................. G01R 27/32 |
| 11,329,354 B1 * | 5/2022 | Tsironis ................... H01P 3/10 |

OTHER PUBLICATIONS

Load Pull Measurements [online], Wikipedia [Retrieved on Nov. 18, 2016] Retrieved from Internet <URL: http://en.wikipedia.org/wiki/Load_pull>.
"Computer Controlled Microwave Tuner, CCMT", Product Note 41, Focus Microwaves Inc. 1998.

* cited by examiner

Primary Examiner — Stephen E. Jones

(57) ABSTRACT

A low-profile slide screw impedance tuner with rotating disc-shaped tuning probes uses a mechanical arrangement for correcting the skewing of the reflection factor response of the rotating tuning probes. As the axis of the control motor turns, a protruding pin pushes against a fixed limit stop block and shifts the motor and its axis, and by that the tuning probe, in the opposite direction of the rotation shift. This corrects for the skewing phase rotation.

5 Claims, 14 Drawing Sheets

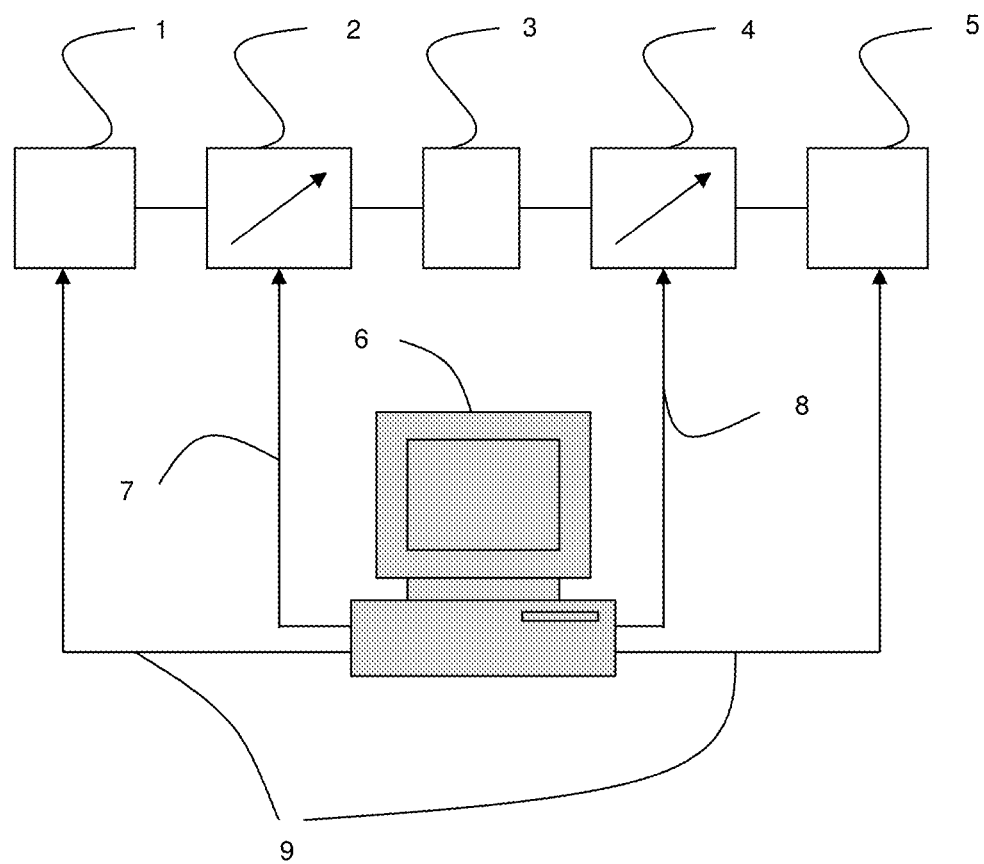
FIG. 1: Prior art

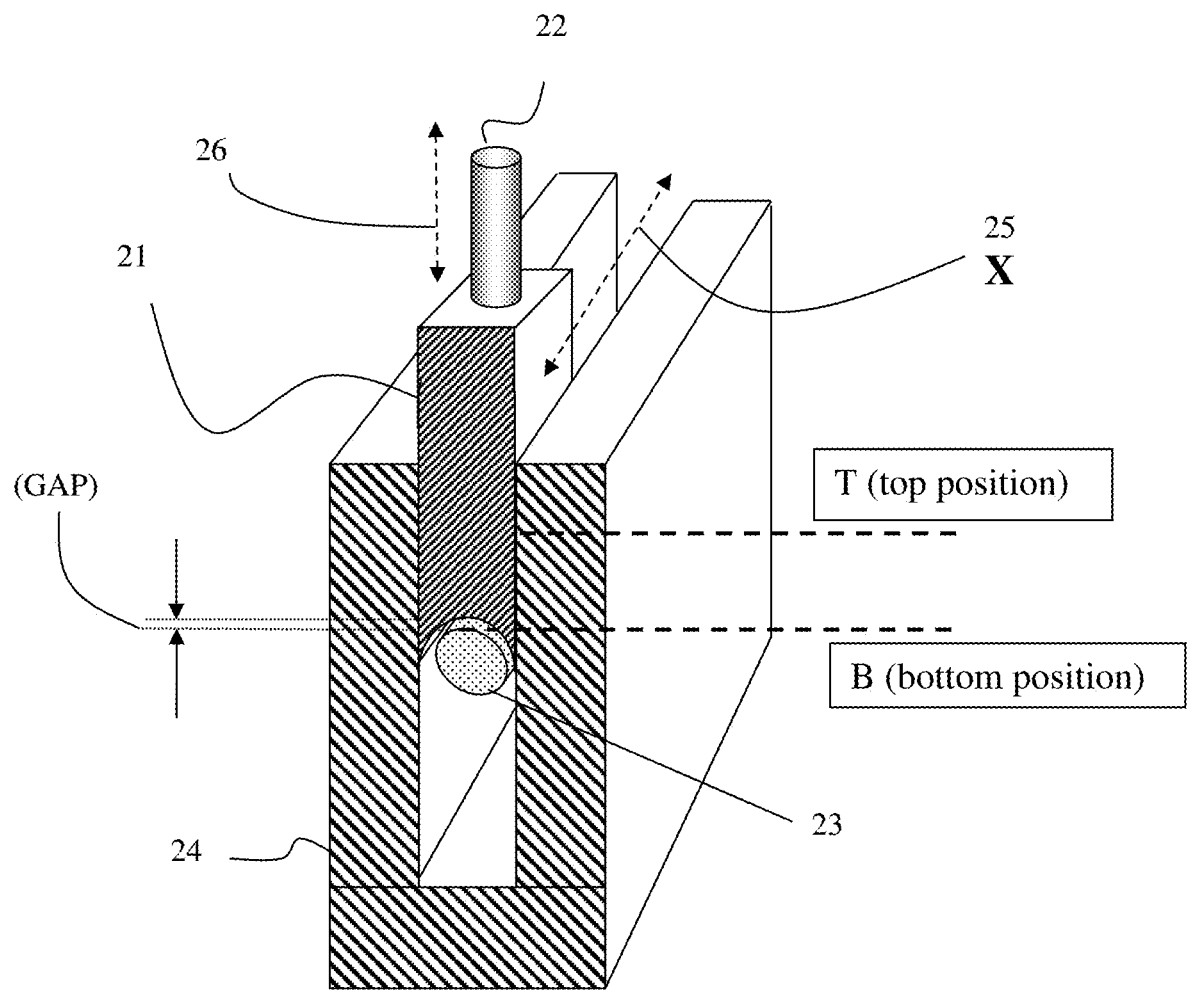
FIG.2: Prior art

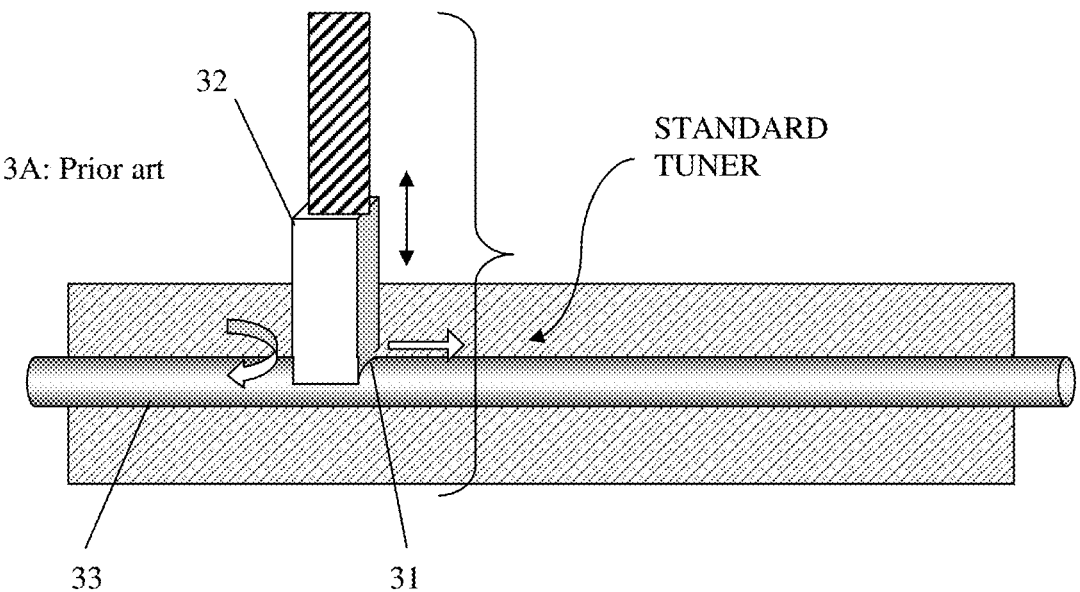
FIG. 3A: Prior art
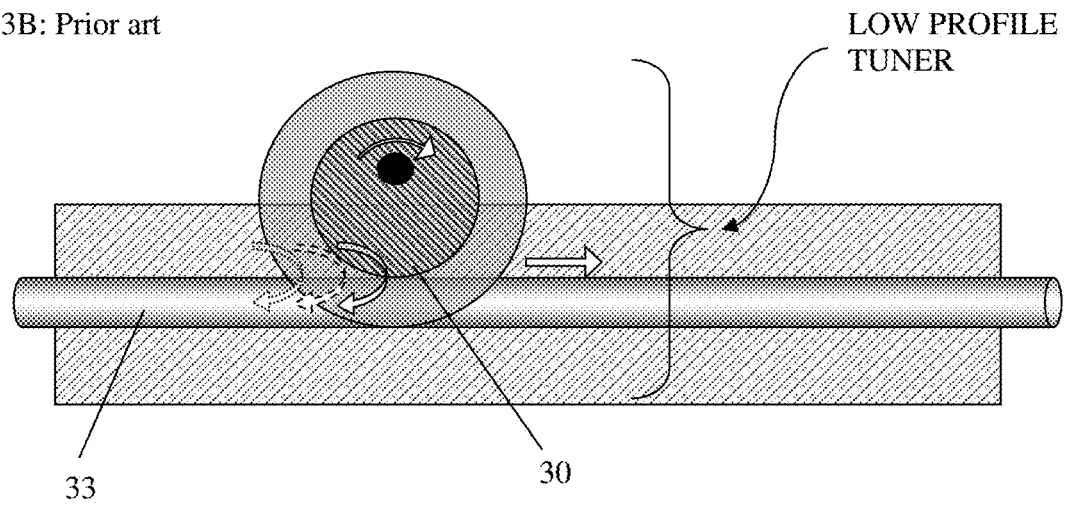
FIG. 3B: Prior art

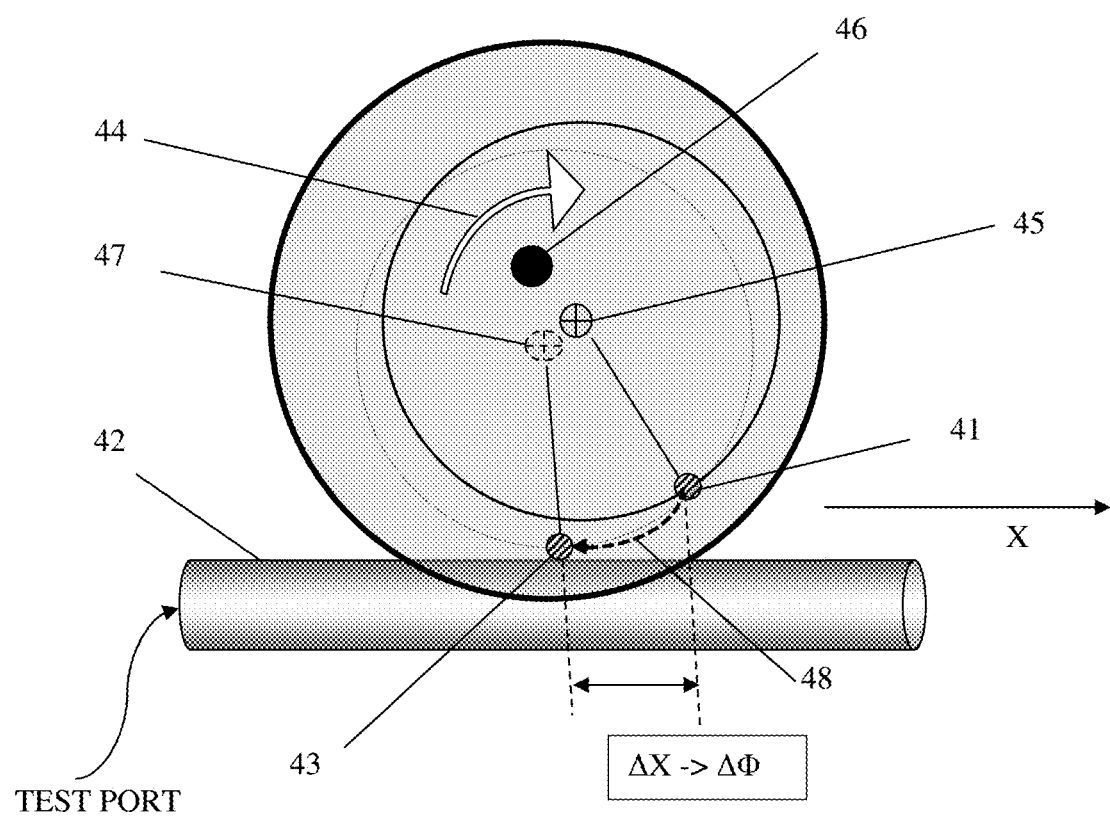
FIG. 4: Prior art

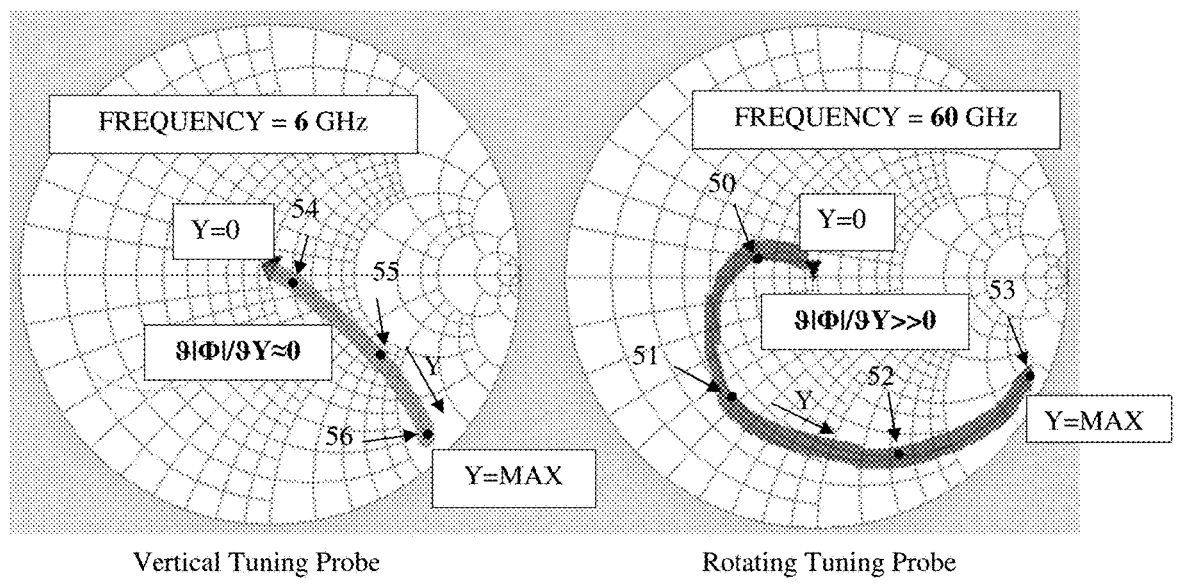
Vertical Tuning Probe
FIG. 5A: Prior art
Rotating Tuning Probe
FIG. 5B: Prior art

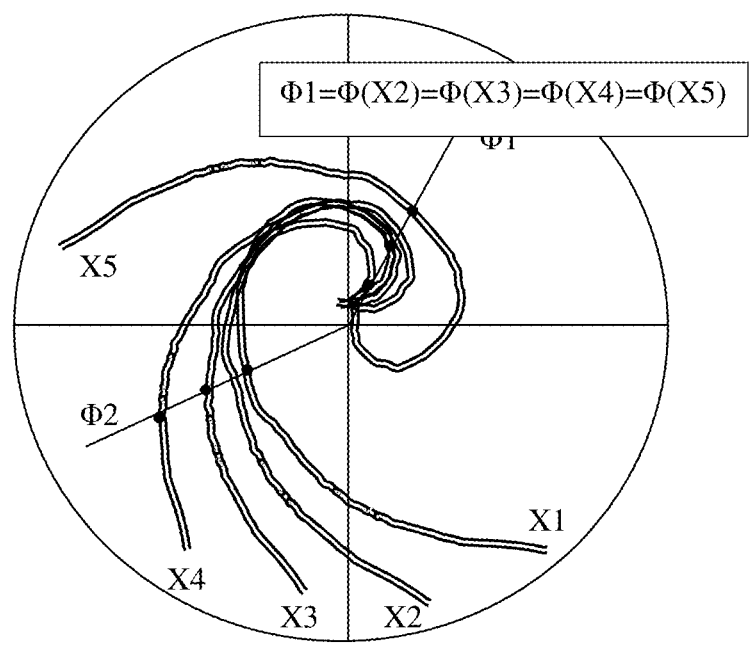
FIG.6: Prior art

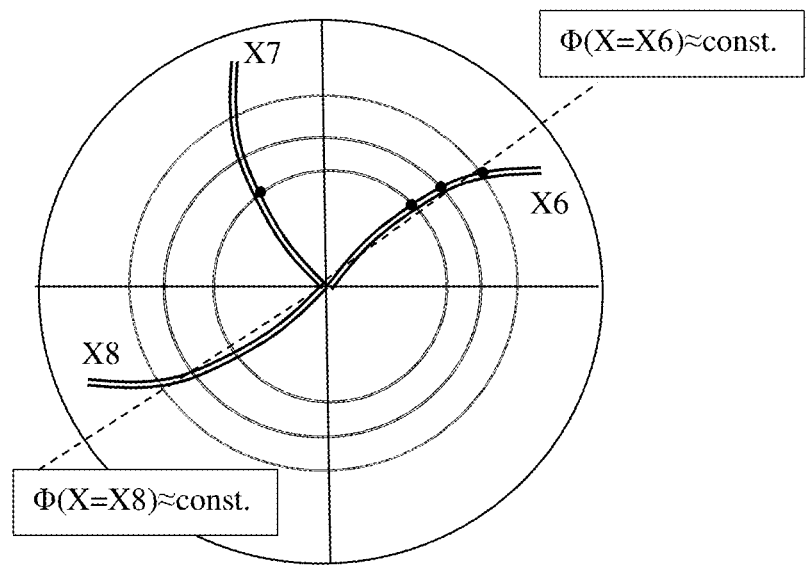
FIG.7: Prior art

US 11,581,623 B1

ANTI-SKEWING LOAD PULL TUNER WITH ROTATING PROBE

PRIORITY CLAIM

Not Applicable

CROSS-REFERENCE TO RELATED ARTICLES

1. Load Pull Measurements" [online], Wikipedia [Retrieved on Nov. 18, 2016] Retrieved from Internet <URL: http://en.wikipedia.org/wiki/Load_pull>
2. "Computer Controlled Microwave Tuner—CCMT", Product Note 41, Focus Microwaves January 1998.
3. "Computer Controller Microwave Tuner, CCMT-5010 (1-50 GHz)", Datasheet, Focus Microwaves Inc.
4. Tsironis C., U.S. Pat. No. 9,257,963, "Impedance Tuners with Rotating Probes".
5. Tsironis C., U.S. Pat. No. 9,625,556, "Method for Calibration and Tuning with Impedance Tuners".
6. Tsironis C., U.S. Pat. No. 10,700,402, "Compact millimeter-wave tuner".

BACKGROUND OF THE INVENTION

This invention relates to microwave (μW) and millimeter-wave (mmW) frequencies load and source pull testing of medium and high-power RF transistor chips, especially on-wafer, using remotely controlled electro-mechanical impedance tuners. Modern design of high-power RF amplifiers and mixers, used in various communication systems, requires accurate knowledge of the active device's (microwave transistor's, device under test, DUT) characteristics. In such circuits, it is insufficient for the transistors, which operate in their highly non-linear regime, close to power saturation, to be described using non-linear numeric models only.

A popular method for testing and characterizing such microwave components (transistors) in the non-linear region of operation is "load pull" (see ref. 1). Load pull is a measurement technique employing microwave tuners (see ref. 2) and other microwave test equipment as shown in FIG. 1. The microwave tuners (2, 4) are used in order to manipulate the microwave impedance conditions under which the DUT (3) is tested; the signal is provided by a signal source (1) and the outcoming power is measured by a power meter (5); the whole is controlled by a PC (6), which controls the instruments and the tuners using digital control cables (7, 8 and 9).

DESCRIPTION OF PRIOR ART

The impedance tuners use tuning probes inserted into a slotted transmission airline (slabline) to create the required reflections (impedances). Block-formed tuning probes (slugs) have the typical form shown in FIG. 2. The block (slug) body (21) has a concave cylindrical bottom similar to the shape of the, typically cylindrical, center conductor (23) of the slabline (24) and is attached to a holding rod (22) which is attached to a precision vertical axis controlled by a vertical stepper motor. The vertical axis moves the tuning probe (slug) (21) towards and away (26) from the center conductor (23) between a Top and a Bottom position. This controls the amount of reflected signal from the signal injected into the slabline and thus the amplitude of the reflection factor, created by the tuning probe. A different mechanism moves the probe horizontally (X) along (25) the slabline. This controls the phase of the reflection factor relative to a reference test port. The cartesian movement (X, Y) of the tuning probe corresponds to an equivocal polar trajectory of the complex reflection factor $\Gamma=|\Gamma|*\exp(j\Phi)$ with $|\Gamma|\approx|\Gamma(Y)|$ and $\Phi=\Phi(X)$. Interpolation between calibration points and impedance synthesis (tuning) algorithms have, so far, been based (see ref. 5) on this specific coordinate system best describing the hitherto natural tuner behavior.

Eccentrically rotating tuning probes in impedance tuners (see ref. 4) offer an efficient method of reducing the height of a standard tuner body (FIG. 3A) towards a low-profile (FIG. 3B) unit allowing easier integration into the cramped area (FIGS. 8 and 9 in ref. 6) of a wafer probe station. Whereas a traditional vertical axis requires a minimum height (FIG. 2 in ref. 4) to provide guidance, precision and stability of the vertically moving tuning probe (32), the corresponding mechanism using a rotating probe allows for a height reduction (increase in flatness) of typically a factor of 2. The reflection is created essentially at the closest point between the rotating tuning probe (30) in FIG. 3B, or the non-rotating tuning probe (31) in FIG. 3A, and the center conductor (33).

However (FIG. 4), as the disc-shaped probe rotates (44) around the eccentric rotation axis (46), the center of the disc (45) moves to position (47) and the reflecting area (41) moves on a curved trajectory (48) towards position (43) closer to the center conductor (42) and to the test port. This means that, even though the axis (46) does not move horizontally (X), the reflecting area of the rotating tuning probe does. At high frequencies (>20 GHz) this creates a horizontal shift ΔX leading to a phase change $|\Delta\Phi|=4\pi*|\Delta X|/\lambda$, relative to the test port (FIG. 5B). At low frequencies this phase change is imperceptible, since $|\Delta X|<<\lambda$ leading to an approximately linear trajectory (54, 55, 56) shown in FIG. 5A. But as the frequency increases, the few millimeters of ΔX come closer to the wavelength λ and affect the behavior of the reflection factor trajectory creating "mechanically caused phase skewing" (FIG. 5B, items 50, 51, 52, 53).

"Tuning" is the process of synthesizing physically a given reflection factor, or impedance. The relation between the reflection factor Γ and the impedance Z is: $Z=Z_o*(1+\Gamma)/(1-\Gamma)$. Γ=0 is at the center of the Smith chart and corresponds to $Z=Z_o=50\Omega$; Γ=1 is at the right edge and corresponds to Z=∞, and Γ=−1 is at the left edge and corresponds to Z=0. Zo is the characteristic impedance of the system, typically 50Ω. To synthesize any impedance the tuner not only must have a very high positioning resolution, which, when using appropriate gear reduction, is easily feasible, but a previous calibration must either contain a huge number of calibrated points, or the control software be able to interpolate accurately between calibration points. Tuner models, despite linear and well behaving, have been tried in the past and been discarded, because of the best achievable tuning accuracy of ~5%, whereas direct calibration and interpolation (see ref. 5) yields tuning accuracy between 0.03 (−70 dB) and 1% (−40 dB).

In the case of rotating tuning probes (FIGS. 3B and 5B) the interpolation algorithm does not work above a certain frequency of operation F, because the unambiguous cartesian relation between amplitude and phase of the reflection factor, caused by the horizontal (phase) and vertical (amplitude) movement of the tuning probe, is lost (FIG. 6). For the prior art interpolation theory between calibration points to work accurately it must be: $\partial|\Phi|/\partial Y\approx 0$ and $\partial|\Gamma|/\partial X\approx 0$ which is approximately valid for a vertically moving tuning probe or at low frequencies (FIG. 5A), but clearly invalid for a rotating probe above a certain frequency (FIGS. 5B and 6). As FIG. 6 also shows, the additional handicap facing interpolation and tuning (impedance synthesis) algorithms of rotating probes is the multitude of horizontal positions Xi yielding the same phase Φ1, Φ2 . . . other than in a cartesian grid, where each pair {Xi, Yj} of horizontal and vertical positions of the tuning probe yields a single and unique reflection factor $\Gamma_k=|\Gamma_k|*\exp(j\Phi_k)$; see FIGS. 5A and 7 where on each circle Y=const. for each horizontal X position, there is always a unique phase F. To solve this problem for a low-profile millimeter-wave tuner, either a new coordinate system is required or a new probe control concept is needed.

BRIEF DESCRIPTION OF THE INVENTION

The invention is a mechanical arrangement for correcting the skewing of the reflection factor response of rotating disc-shaped tuning probes in slide screw impedance tuners. A simple solution is to have the rotating axis of the motor controlling the disc-shaped rotating tuning probe having a protruding pin pushing against a fixed limit and shifting the motor and the axis, and by that the tuning probe, in the opposite direction of the rotation caused phase shift. This corrects for the skewing phase rotation. More complex mechanisms are imaginable but do not affect the concept of combining the phase controlling horizontal movement with the amplitude controlling vertical movement to linearize the probe response.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a typical automated transistor load pull test system.

FIG. 2 depicts prior art, a perspective view and relevant dimensions and parameters of the operation of a vertically operating RF tuning probe (slug).

FIGS. 3A through 3B depict prior art, two tuning probe control concepts:

FIG. 3A depicts the traditional vertical tuning probe; FIG. 3B depicts the rotating tuning probe concept.

FIG. 4 depicts prior art, the detailed operation and relevant items of a rotating tuning probe.

FIGS. 5A through 5B depict prior art, FIG. 5A depicts the reflection factor response of a vertically moving probe or a rotating probe at low frequencies and FIG. 5B depicts the reflection factor response of a rotating probe at higher frequencies (typically above 20 GHz).

FIG. 6 depicts prior art, reflection factor trajectories of rotating tuning probes for various horizontal tuning probe positions.

FIG. 7 depicts prior art, reflection factor trajectories of vertical moving block tuning probes (slugs) for various horizontal tuning probe positions.

DETAILED DESCRIPTION OF THE INVENTION

This invention discloses an automated low-profile load pull impedance tuner apparatus suitable for optimum integration in on-wafer test setups for testing of semiconductor micro-chips at high and very high (millimeter-wave) frequencies (see ref. 6). Low-profile is defined here in comparison with prior art automated slide-screw tuners (FIG. 4, see ref. 3). A reduction of height perpendicular to the slabline by a factor of at least 2 is hereby defined as low-profile.

Figure 8:
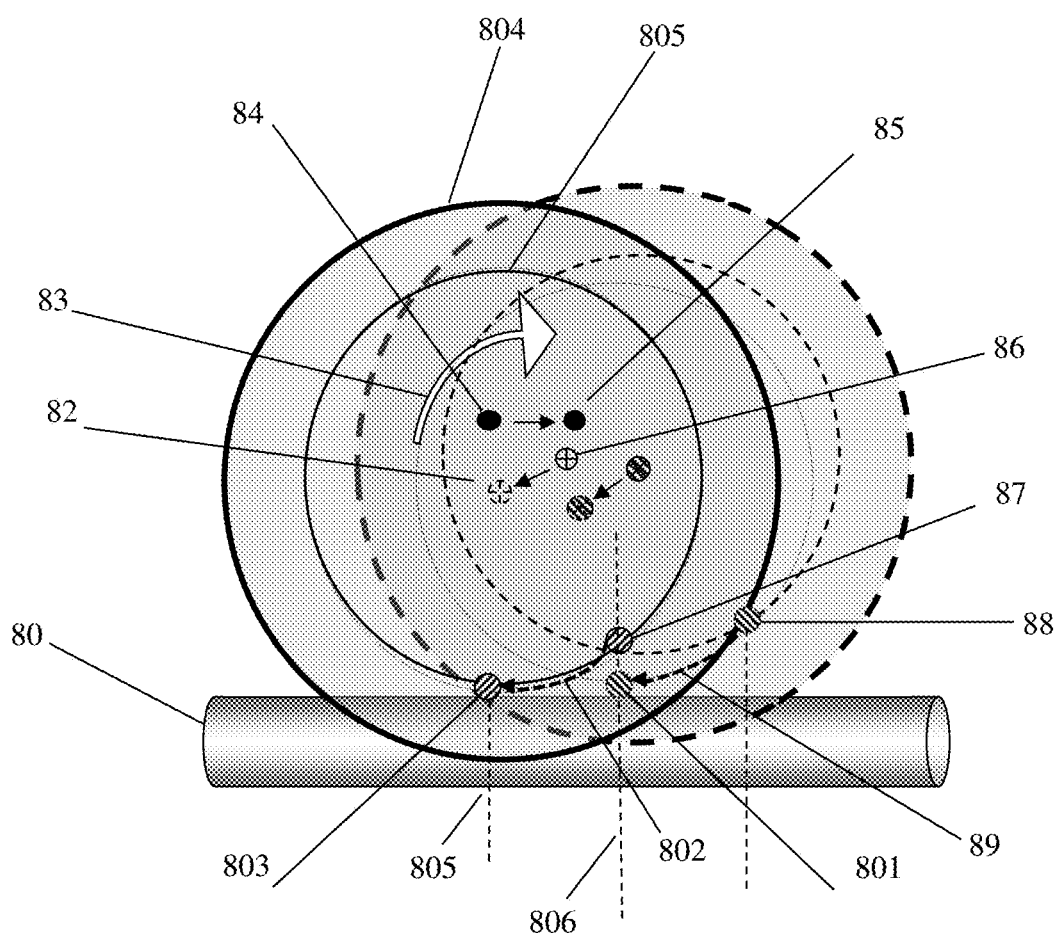
FIG. 8 depicts compensation of horizontal mechanically caused skewing by shifting the rotation center of the eccentrically rotating disc tuning probe.

The proposed mechanism for compensating the mechanical skewing, created by the rotating disc tuning probes is shown in FIG. 8: The disc-shaped tuning probe has, because of the concave shape of its edge, an external periphery (804) and an internal periphery (805); it rotates (83) around the eccentric center (84); the point (86) moves to (82) and the point (87) at the internal core (805) moves to (803) on a trajectory (802); this creates the horizontal shift between the traces (806) and (805), which is the cause of the mechanical skewing. The proposed solution is to move the rotation center from (84) to (85) in which case the point (87) moves to (801) instead, following the trajectory (89). In between the original point (87) moves to (88) first and then rotates down to (801); now the point (801) is on the core (805) of the tuning disc and creates high reflection, because it is close to the center conductor (80); at the same time, though, the point (801) is on the same vertical plan (806) as the original point (87); it looks therefore as if the tuning point moves only vertically from low reflection (87) to high reflection (801) same as a prior art vertically moving block tuning probe (slug). Without the horizontal shift the point the point (87) would move to (803) and create the skewing effect.

Figure 9:
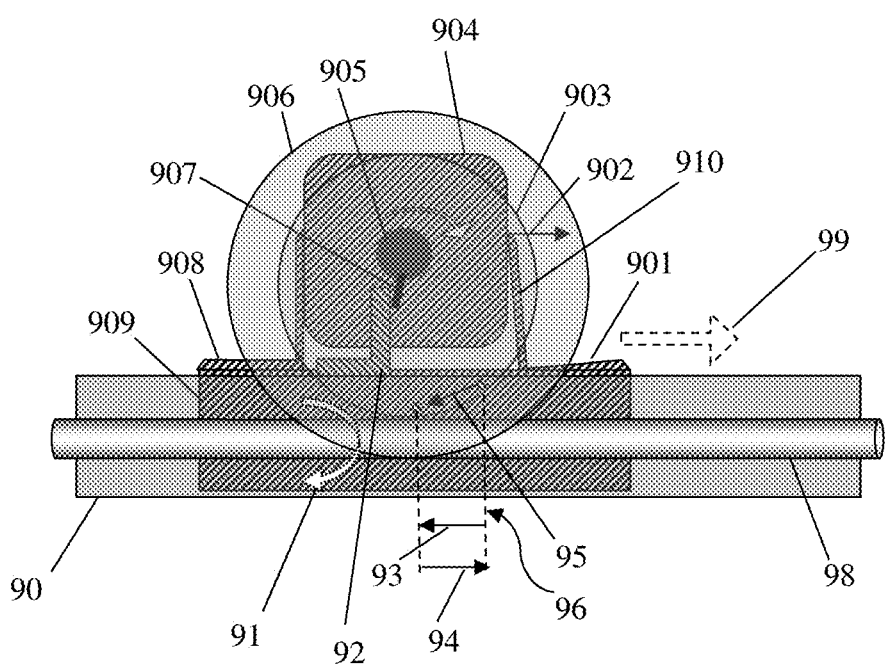
FIG. 9 depicts mechanical anti-skewing mechanism.

FIG. 9 depicts the mechanism for skewing compensation inside the slabline (90) and relative to the center conductor (98) and the horizontal axis (99). The disc-probe (906) rotates around the motor (904), the motor axis (905) to bring the core (903) of the disc-probe close to the center conductor (98) and create the reflection (91); the axis (905) has a permanently attached pin protrusion (907), which hits on a stop block (92) and pushes the motor (904) to the right (902), away from the test port; this way the uncorrected move (93) does not occur, instead it is compensated by the move (94); and the move (95) does not occur relative to the plan (96). To be able to shift to the right (99) the motor (904) cannot be permanently attached to the mobile carriage (909), instead it must be movable relative to it. A simple solution is to suspend the motor (904) using steel, L-shaped angles (908) and (901) above the mobile carriage (909), of which two angles, the vertical member (910) of the angle (901) has been inclined towards the test, port to allow for the motor (904) shift away from the test port. The bottom segments of the steel angles (908) and (901) are permanently attached to the mobile carriage (909).

Figure 10:
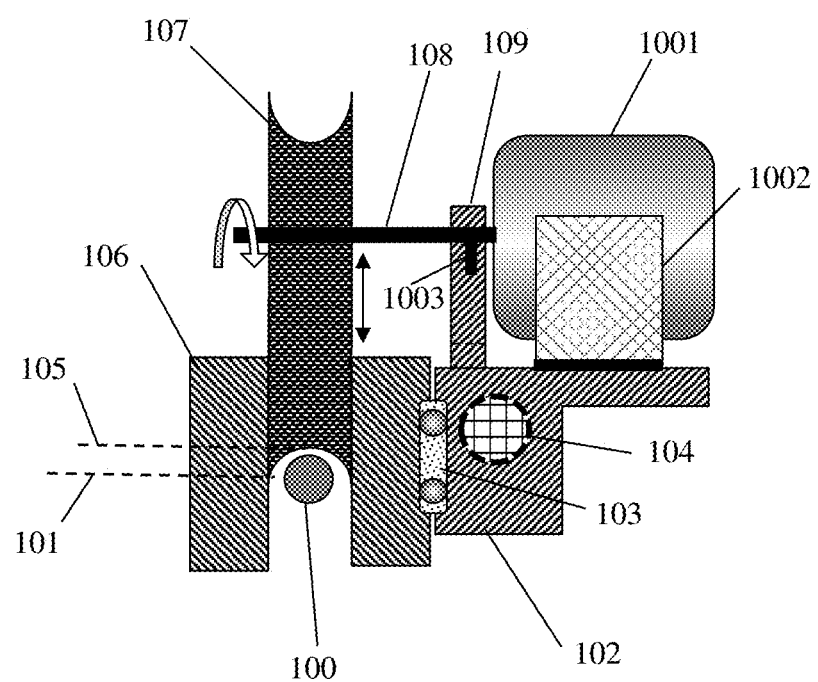
FIG. 10 depicts cross section of mechanical anti-skewing mechanism.

The anti-skewing mechanism becomes better understood in the cross view of FIG. 10: The stepper motor (1001) is suspended above the mobile carriage (102) using the steel angle (1002). The mobile carriage (102) is moved horizontally using the ACME lead screw (104) or other control gear, such as belt drive or rack and pinion etc. and slides along the slabline (106) using a slider (103). The motor axis (108) has a protruding pin (1003) which pushes against the stop block (109). The motor axis (108) traverses and controls the disc-shaped tuning probe (107) which rotates and penetrates (slides) between the sidewalls of the slabline (106) approaching or distancing from the center conductor (100). The traces (105) and (101) delimitate the core and the edge (rim) of the concave groove at the periphery of the tuning disc probe (107).

Figure 11:
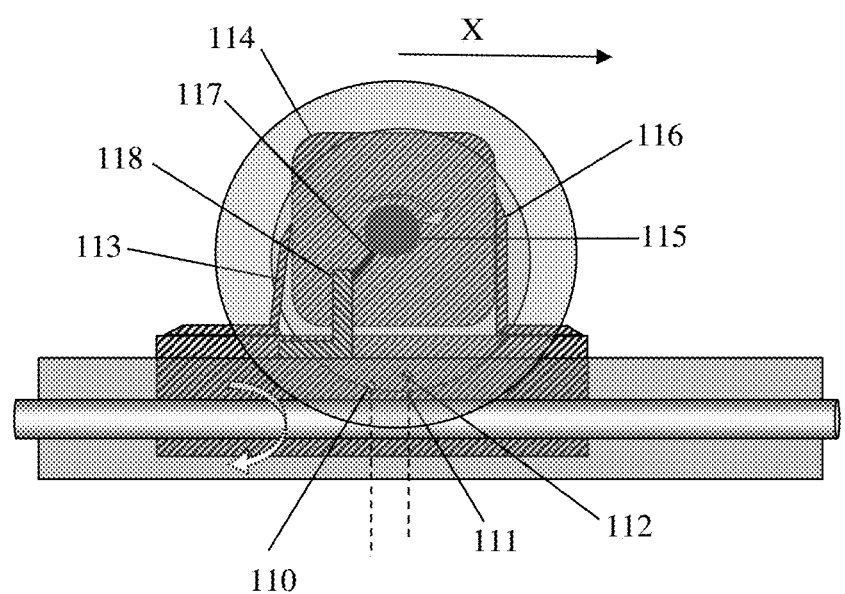
FIG. 11 depicts front view of the mechanical application of the anti-skewing mechanism of FIG. 9.

In FIG. 11 we recognize the state of the system, whereby the tuning probe has rotated into the slabline to create high reflection: the motor (114) has shifted away from the test port by the push of the pin (117) of the rotating motor axis (115) against the stop block (118) and the steel angle (113) is bent in X direction to allow the motor to shift horizontally. The opposite steel angle (116) was pre-bent towards the test port (see item (901) in FIG. 9) to allow for this shift. The steel angles can be replaced by a multitude of other known sliding and springing pre-loaded mechanisms. This way the point (112) has now moved to position (111) instead to position (110), which is vertically below the previous position of point (112).

Figure 12:
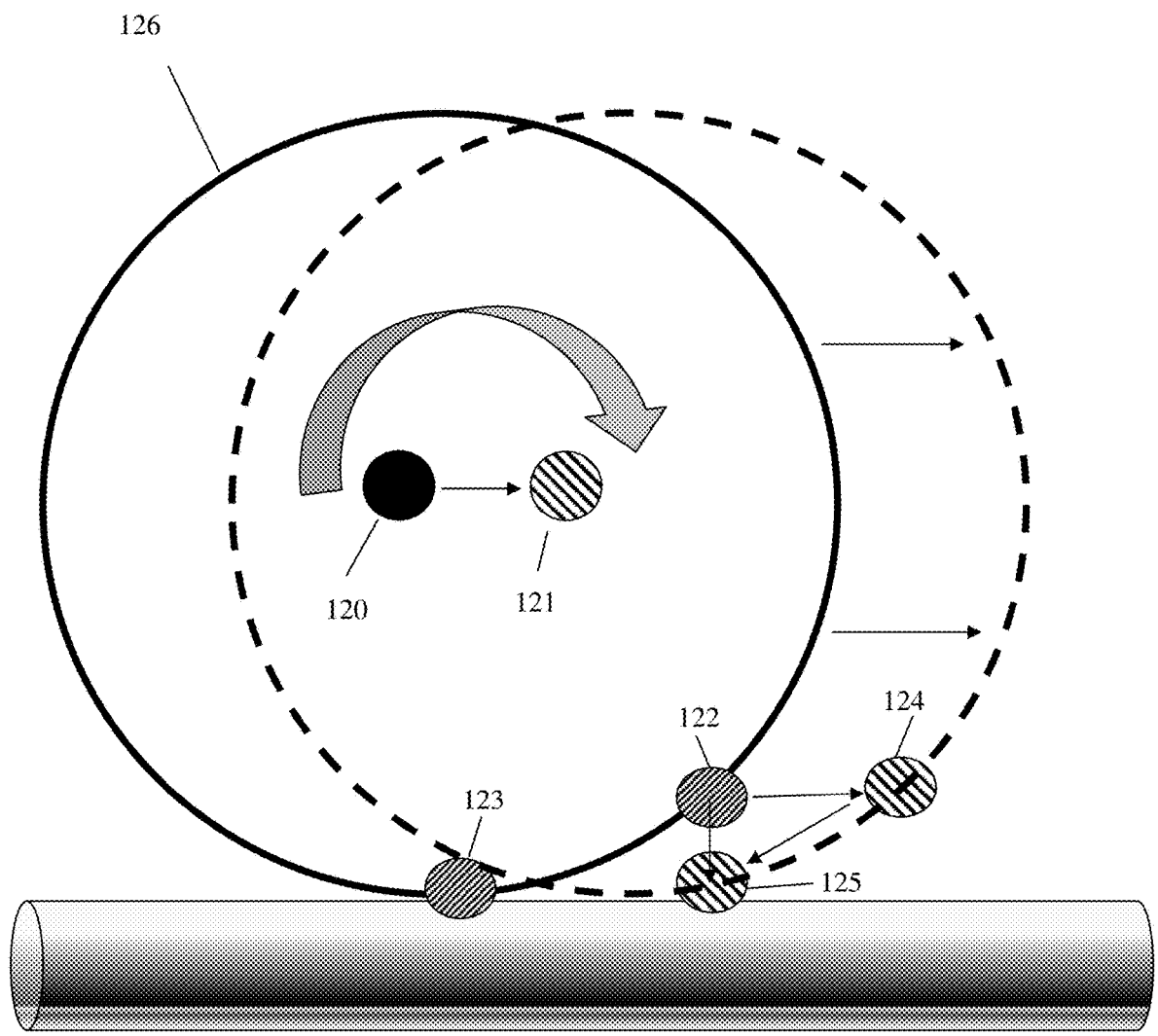
FIG. 12 depicts the detail of the rotating disc tuning probe movement to compensate for the mechanically caused phase skewing.

The movement of the rotating disc-probe (126) in order to compensate for the skewing is shown in explicit detail in FIG. 12: As the disc rotates its rotation center (120) moves to (121); therefore, the point at the periphery (122) instead of moving to the position (123) and cause the skewing, it moves to the position (124) first, and to the position (125) next, which is vertically below the position (122), as if it would be a vertically moving and not a rotating probe.

Figure 13:
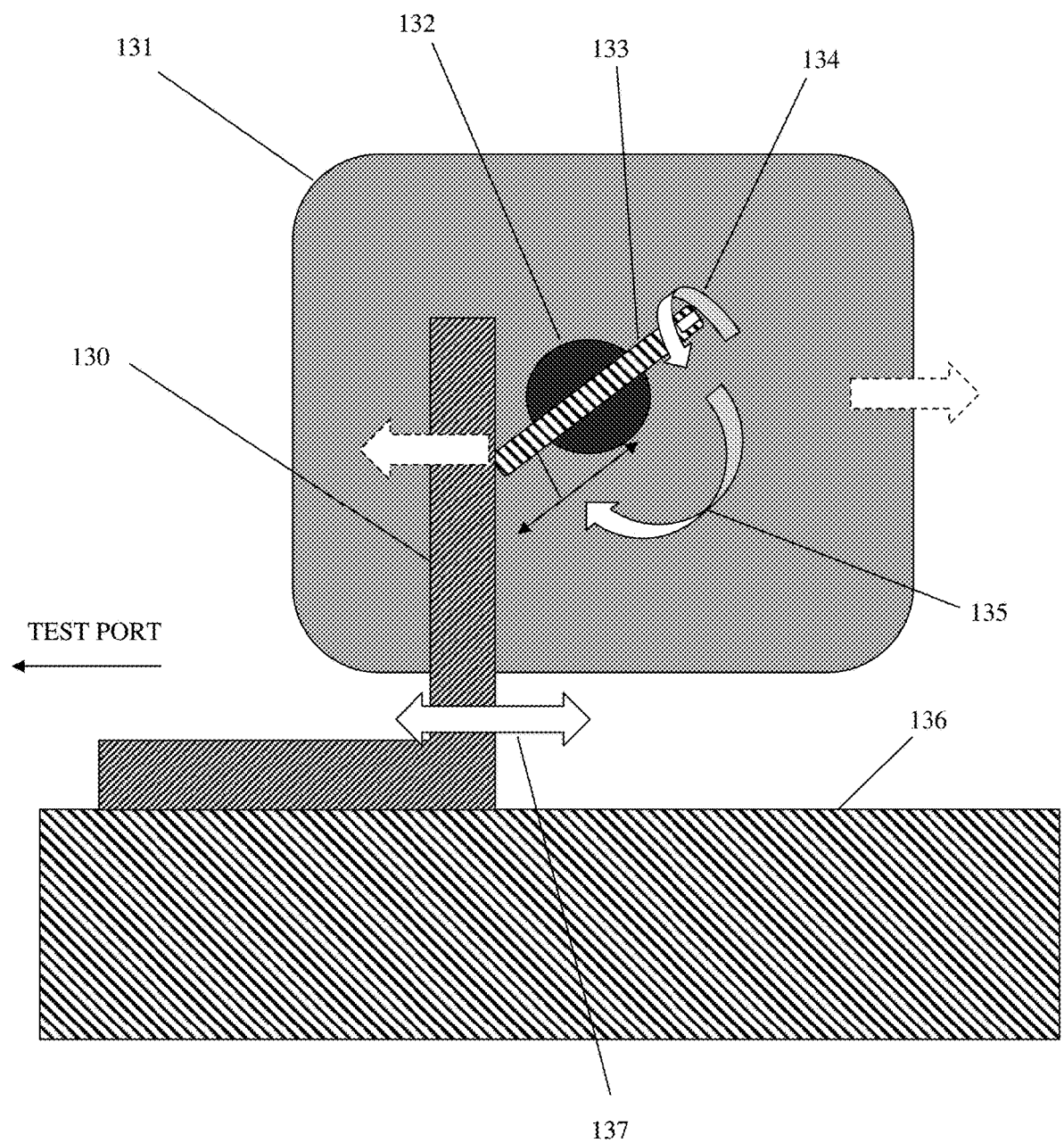
FIG. 13 depicts the protruding pin of the tuning probe controlling motor axis in form of a screw traversing the axis.

FIG. 13 shows the technique/method used to adjust the amount ΔΦ of anti-skewing proportional to ΔX, required for the specific operation frequency F based on the relation ΔX (mm)=ΔΦ(rad)*F(GHz)/(1200*π) or ΔX (mm)=0.42*ΔΦ (°)/F (GHz), as an example: at 60 GHz one needs 0.63 mm to rotate 90°. In this case the protruding pin (907) is a screw (133), which traverses the axis (132) of the motor (131) and, by adjusting the amount protruding beyond the axis (132); this allows controlling the shift ΔX of the motor (131) relative to the mobile carriage (136), caused by the push of the rotating (135) screw (133) against the stop block (130), which is fixed on the mobile carriage (136), by adjusting (134) its protrusion. Alternatively, the protrusion on the motor axis may be fixed and the horizontal position (137) of the stop block (130) can be adjustable on the mobile carriage (136).

Figure 14:
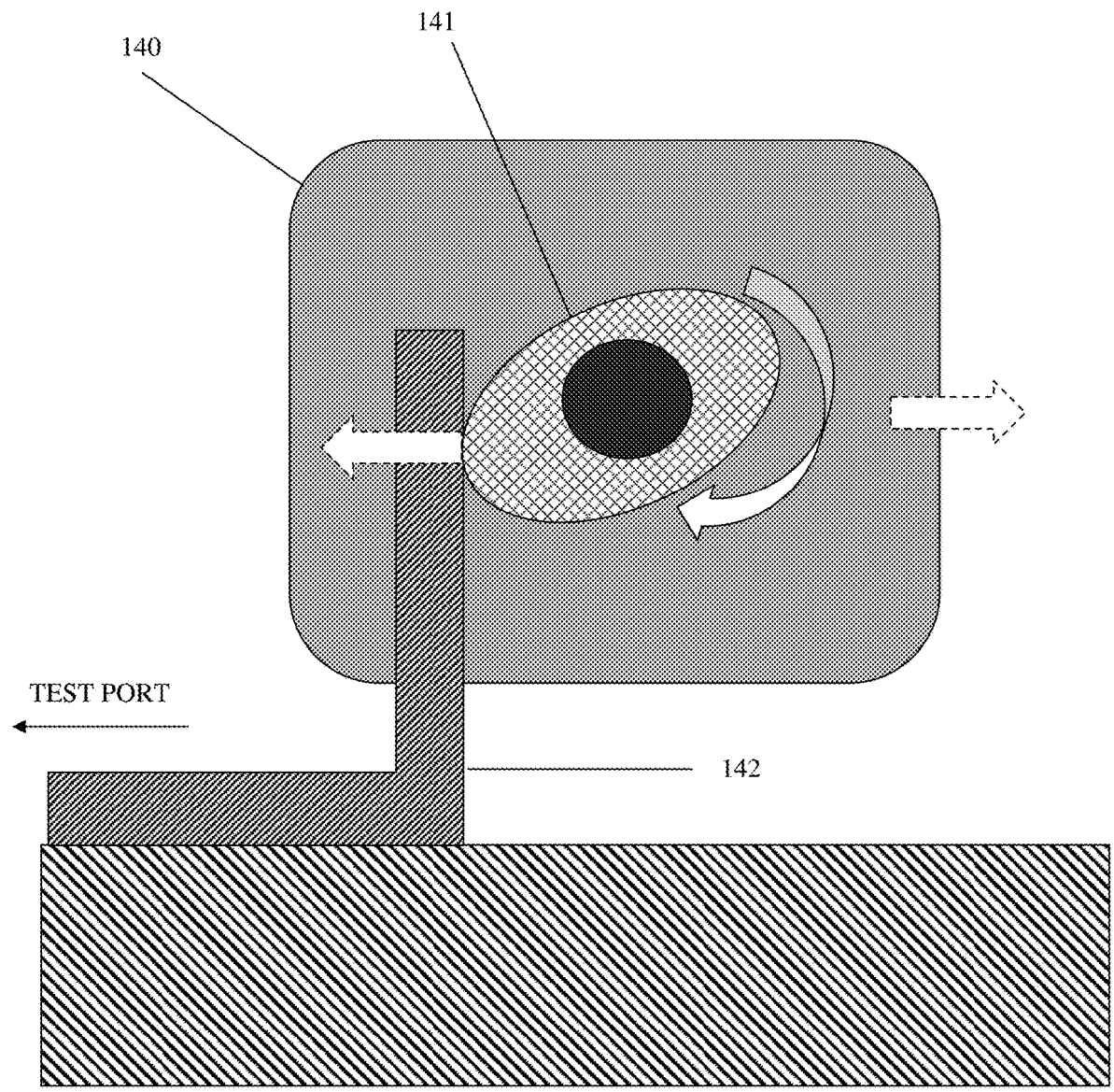
FIG. 14 depicts the perpendicular protrusion being an eccentrically mounted disc, or an oval or elliptic disc.

The protrusion pushing against the fixed block (142) can be a disc (141) traversed by the motor axis; in this case the motor (140) axis does not need to be drilled and threaded (FIG. 14). The disc can be circular, mounted eccentrically, or elliptic or oval. Important is only that, when the motor axis rotates its protruding segment pushes against the stopping block (142). The amount of anti-skewing is adjustable by choosing the right amount of protrusion of the disc and the angle of mounting on the axis.

The concept of low-profile impedance tuner with mechanical anti-skewing mechanism has been disclosed using a preferred embodiment. Obvious alternatives, especially concerning the anchoring of the suspended mobile carriage, are imaginable but shall not impede on to the general validity of the present invention.

What is claimed is:

1. A low-profile impedance tuner with anti-skewing mechanism, comprising:
   a slabline having two vertical sidewalls, an input and an output port and a center conductor between the ports, and
   a mobile carriage, sliding along the slabline parallel to the center conductor, being controlled by a first stepper motor and control gear and carrying a second stepper motor, both stepper motors being remotely controlled,
   wherein
      an axis of the second stepper motor
         is perpendicular to a sidewall of the slabline,
         holds a disc-shaped, eccentrically rotating conductive tuning probe,
         which penetrates and slides in-between the sidewalls of the slabline and
         includes a perpendicular to the axis protrusion,
   and wherein
      the second stepper motor is movable along the slabline relative to the mobile carriage and is spring-loaded towards the test port,
   and wherein
      as the axis of the second stepper motor turns, the perpendicular protrusion rotates and hits on a vertical stopping block attached on the mobile carriage and pushes the second stepper motor away from the test port.

2. The low-profile impedance tuner with anti-skewing mechanism of claim 1,
   wherein
      the perpendicular protrusion to the axis of the second stepper motor is a screw traversing the axis,
   and wherein
      the penetration of the traversing screw is adjusted for required anti-skewing horizontal shift of the second motor at a frequency of operation.

3. The low-profile impedance tuner with anti-skewing mechanism of claim 1,
   wherein
      the perpendicular protrusion to the axis of the second stepper motor is a disc traversed eccentrically by the axis,
   and wherein
      the eccentricity of the disc is adjusted for required anti-skewing horizontal shift of the second motor at a frequency of operation.

4. The low-profile impedance tuner with anti-skewing mechanism of claim 1,
   wherein
      the perpendicular protrusion to the axis of the second stepper motor is an oval disc traversed by the axis,
   and wherein
      the mounting angle of the oval disc is adjusted for required anti-skewing horizontal shift of the second motor at a frequency of operation.

5. The low-profile impedance tuner with anti-skewing mechanism of claim 1,
   wherein
      a position of the stopping block is adjustable on the mobile carriage along the slabline,
   and wherein
      the position of the stopping block is adjusted for required anti-skewing horizontal shift of the second motor at a frequency of operation.

\* \* \* \* \*